United States Patent [19]

Sakiyama et al.

[11] Patent Number: 5,475,699
[45] Date of Patent: Dec. 12, 1995

[54] METHOD FOR SELECTING A SEMICONDUCTOR LASER

[75] Inventors: Hajime Sakiyama; Hiroshi Mataki, both of Kyoto, Japan

[73] Assignee: Rohm Co., Ltd., Kyoto, Japan

[21] Appl. No.: 255,704

[22] Filed: Jun. 7, 1994

[30] Foreign Application Priority Data

Jun. 10, 1993 [JP] Japan ..................... 5-139655

[51] Int. Cl.$^6$ ..................................... H01S 3/18
[52] U.S. Cl. ................................. 372/43; 372/25
[58] Field of Search ........................... 372/25, 43

[56] References Cited

FOREIGN PATENT DOCUMENTS 1-204491  8/1989  Japan .
3-191879  8/1991  Japan .

Primary Examiner—Rodney B. Bovernick
Assistant Examiner—Yisun Song
Attorney, Agent, or Firm—Nikaido, Marmelstein, Murray & Oram

[57] ABSTRACT

A method for selecting a semiconductor laser exhibiting a desired relaxation oscillation frequency, including the steps of: (a) finding a correlation between a visibility of interference fringes of laser light generated by a sampled semiconductor laser and a relaxation oscillation frequency of the sampled semiconductor laser; and (b) measuring a visibility of interference fringes of laser light generated by each of semiconductor lasers to be subjected to selection and finding a relaxation oscillation frequency of that laser from the visibility thus measured with use of the correlation. This method is capable selecting semiconductor lasers exhibiting optimal high speed response characteristics for optical communications with less cost, avoiding a decrease in productivity for such lasers, and contributing to mass productivity therefor.

4 Claims, 5 Drawing Sheets

METHOD FOR SELECTING A SEMICONDUCTOR LASER

BACKGROUND OF THE INVENTION

The present invention relates to a method for selecting a semiconductor laser. More particularly, it relates to a method for selecting a semiconductor laser of a high response speed for use in optical data communications requiring a high transmission rate and a high S/N ratio.

It is generally known that the high speed responsivity of a semiconductor laser is restricted by relaxation oscillation frequency ( refer to, for example, Ryoichi Itoh et al., "SEMICONDUCTOR LASER", published by BAIFUKAN CO., LTD., 1989, p. 268). Therefore, with semiconductor lasers adapted for optical communications of a high transmission rate, the high speed responsivity thereof serves as an important parameter and, hence, there is needed to select a semiconductor laser of a suitable relaxation oscillation frequency.

FIG. 4 illustrates a conventional method for selecting a semiconductor laser of a suitable relaxation oscillation frequency, and wherein denoted at numeral 1 is a semiconductor laser, at numeral 7 a pulse generator, at numeral 8 a bias tee, at numeral 9 an ultra-high speed light-receiving element, and at numeral 10 an oscilloscope of sampling type.

An optical output of the semiconductor laser 1 which is pulse driven by the pulse generator 7 is received by the ultra-high speed light-receiving element 9, passed through the bias tee 8 and represented as a pulse response waveform on the sampling-type oscilloscope 10. FIG. 5 illustrates a waveform as obtained in this manner. Relaxation oscillation appears in a rise portion of the pulse response waveform and is measured on the oscilloscope for its relaxation oscillation period $t_{ro}$ to find relaxation osillation frequency $f_r$, which is the reciprocal of $t_{ro}$.

With the conventional method for measuring the relaxation oscillation frequency of a semiconductor laser, relaxation oscillation period $t_{ro}$ is found from a pulse response waveform by using the sampling-type oscilloscope 10 to represent the pulse response waveform and measuring the oscillation period of the waveform thus represented on the oscilloscope 10. This results in the need of a complicated measuring system while involving problems of the measurement taking a relatively long time with degraded precision and of decreased productivity of semiconductor lasers.

The present invention has been accomplished to overcome the foregoing problems. It is, therefore, an object of the present invention to provide a method for selecting a semiconductor laser which is capable of obtaining an optimal semiconductor laser for application to optical communications with less cost and of avoiding a decrease in productivity for such a laser while contributing to mass productivity therefor.

SUMMARY OF THE INVENTION

Intensive study has been repeatedly made to find the fact that there is a correlation between the relaxation oscillation frequency of a semiconductor laser and visibility of interference fringes of laser light thereof and, hence, in selecting a semiconductor laser exhibiting a relaxation oscillation frequency of, for example, higher than a predetermined value, there is needed just to find out a semiconductor laser exhibiting visibility $\gamma$ of higher than a predetermined value. The visibility $\gamma$ is easy to measure using a commercially available interferometer such as a spectrum analyzer or a wavemeter. Therefore, the relaxation oscillation frequency is also easy to find, thus leading to the present invention.

It is preferable that said visibility is measured by obtaining a rate of an intensity of interference using Michelson interferometer.

It is preferable that said visibility is measured by obtaining a rate of an intensity of interference using Mach-Zehender interferometer.

It is preferable that said correlation is obtained by pulse driving said semiconductor laser, signals which is received by an ultra-high speed light-receiving element are represented on an oscilloscope, obtaining a relaxation oscillation period from a response waveform on said oscilloscope and obtaining a relaxation oscillation frequency from said period.

The visibility $\gamma$ is defined herein as $\gamma = Ib/Ia$, where Ia is an amplitude of the envelope of interference fringes of light at an intensity when the optical path difference is 0 (refer to FIG. 3) and Ib is an amplitude of the envelope of interference fringes of the light at any one (which should be determined) of succeeding peak intensities.

In general, the visibility $\gamma$ of laser light indicates the coherence thereof; $\gamma=1$ indicates complete coherence while $\gamma=0$ indicates incoherence. The coherence of laser light is known to be represented by attenuation of visibility V of the following equation which is obtained by measuring the light intensity at peak ($I_{max}$) of interference fringes of the light and that at valley ($I_{min}$) thereof with the use of an interferometer such as Michelson interferometer or Mach-Zehnder interferometer (refer to, for example, Kohichi Shimoda, "An Introduction to Physics of Laser", IWANAMI SHOTEN CO., 1983, P. 27).

$$V=(I_{max}-I_{min})/(I_{max}+I_{min})$$

Assume that Ia represents a peak intensity of envelope of the interference fringes at, for example, the first occurrence of peak, namely when the optical path differenece is 0 and Ib represents that at the second occurrence of peak ( refer to FIG. 3 ), the ratio of Ib to Ia, or Ib/Ia, is generally used to represent the visibility $\gamma$.

Thus, in accordance with the present invention there is provided a method for selecting a semiconductor laser exhibiting a desired relaxation oscillation frequency, comprising the steps of:

(a) finding a correlation between a visibility of interference fringes of laser light generated by a sampled semiconductor laser and a relaxation oscillation frequency of the sampled semiconductor laser; and (b) measuring a visibility of interference fringes of laser light generated by each of semiconductor lasers to be subjected to selection and finding a relaxation oscillation frequency of said each of semiconductor laser from the visibility thus measured with use of the correlation.

In the present invention the correlation is found in advance between visibility $\gamma$, which is a measure of the coherence of laser light generated by a sampled semiconductor laser, and the relaxation oscillation frequency of the sampled laser; hence, the relaxation oscillation frequency level of any semiconductor laser can be found by merely measuring the visibility $\gamma$ in a simplified manner. Thus, a semiconductor laser exhibiting a desired relaxation oscillation frequency can be selected with ease.

DETAILED DESCRIPTION

A method for selecting a semiconductor laser according to the present invention will now be described in detail with reference to the drawings.

Figure 1:
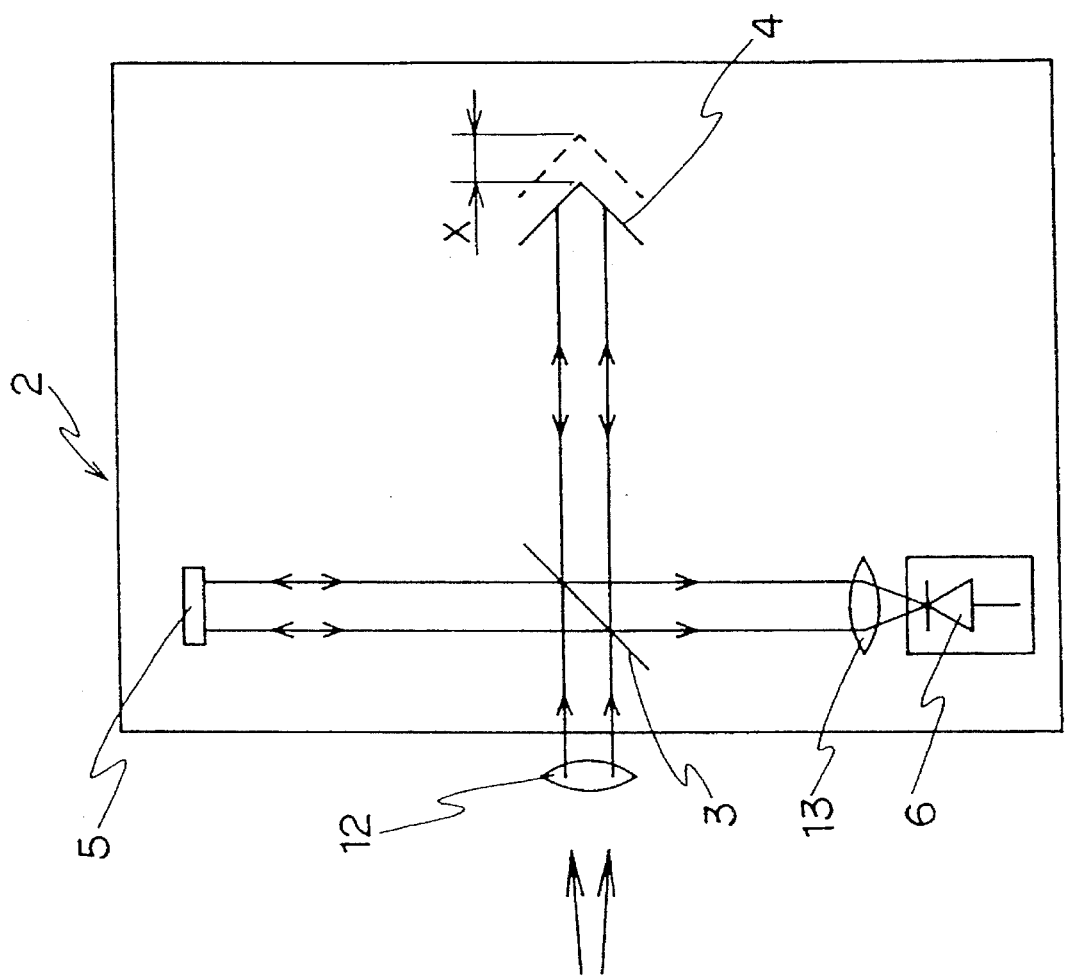
FIG. 1 is a schematic representation of an example of arrangement for use in a method for selecting a semiconductor laser according to the present invention.
Figure 1:
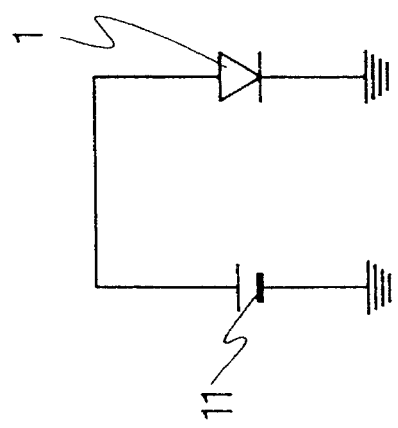

In the method of the present invention, first, the intensity of interference fringes of laser light is measured by a conventional interferometer such as Michelson interferometer 2, the laser light being emitted from a semiconductor laser 1 connected to a direct current source 11, as shown in FIG. 1. Specifically, the incoming light emitted from the semiconductor laser 1 is collimated by a lens 12 disposed on the input side of the Michelson interferometer 2 and then is incident on a half mirror 3 at an angle of incidence of about 45°. At this moment, about a half of the light passes through the half mirror 3 while the rest is reflected by the half mirror in the upward direction which makes an angle of about 90° with respect to the incoming light. The light passing through the half mirror 3 is then reflected by a movable mirror 4, returned to the half mirror 3, and reflected thereat in the downward direction shown which makes an angle of about 90° with respect to the incoming light. The light in the downward direction is condensed by a condenser lens (or converging lens) 13 and then input to a photodetector 6 formed of a photodiode or the like.

Figure 3:
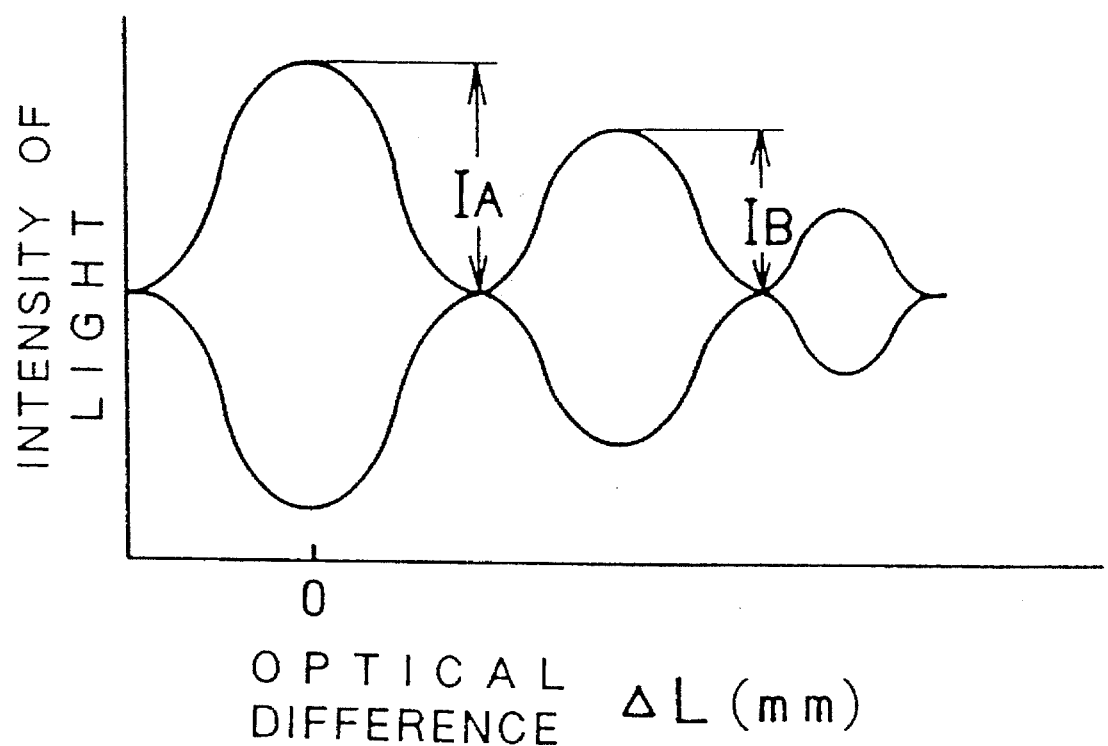
FIG. 3 is a graphic representation of the envelope of interference fringes of laser light for illustrating the visibility of the interference fringes.
Figure 4:
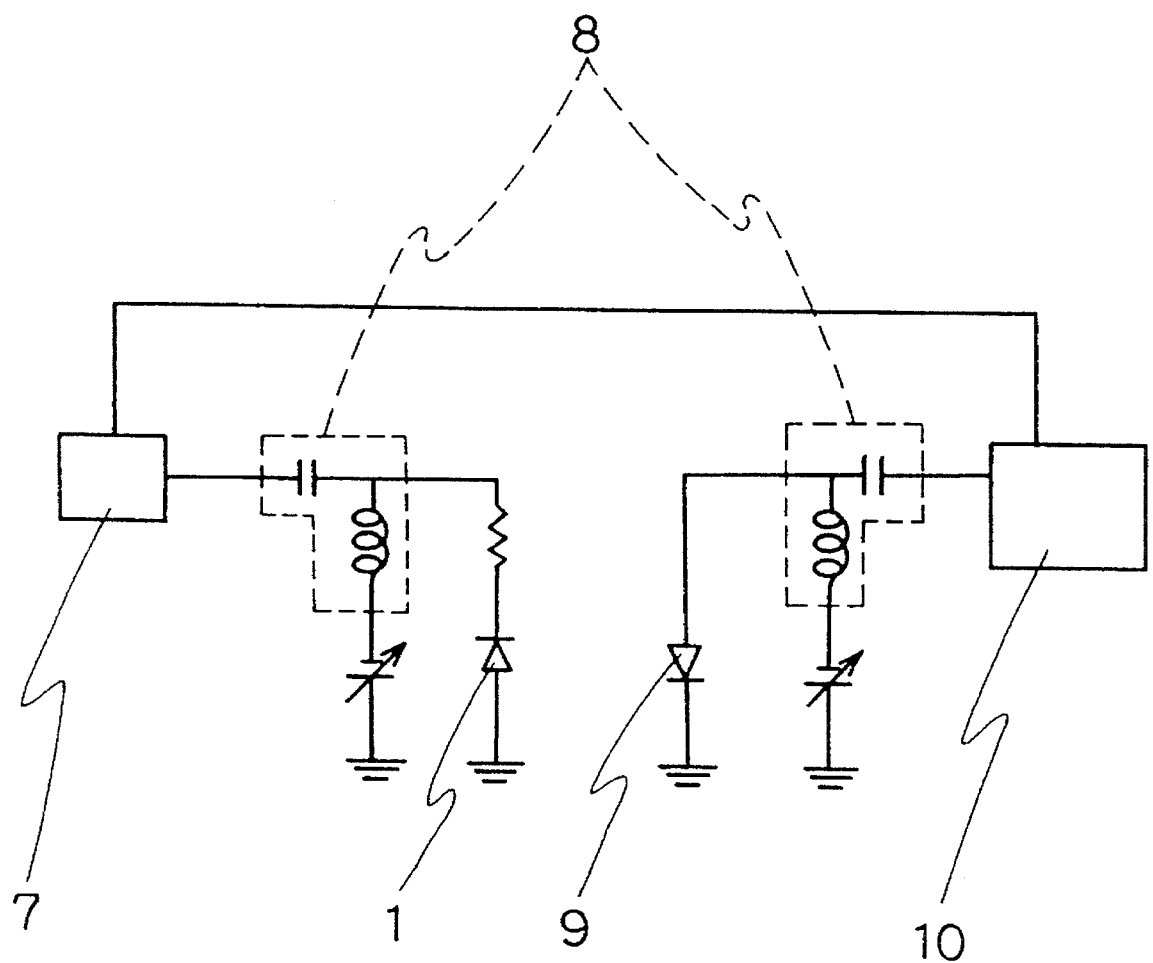
FIG. 4 is a circuit diagram of an example of detection circuit for use in a conventional method for selecting a semiconductor laser.
Figure 5:
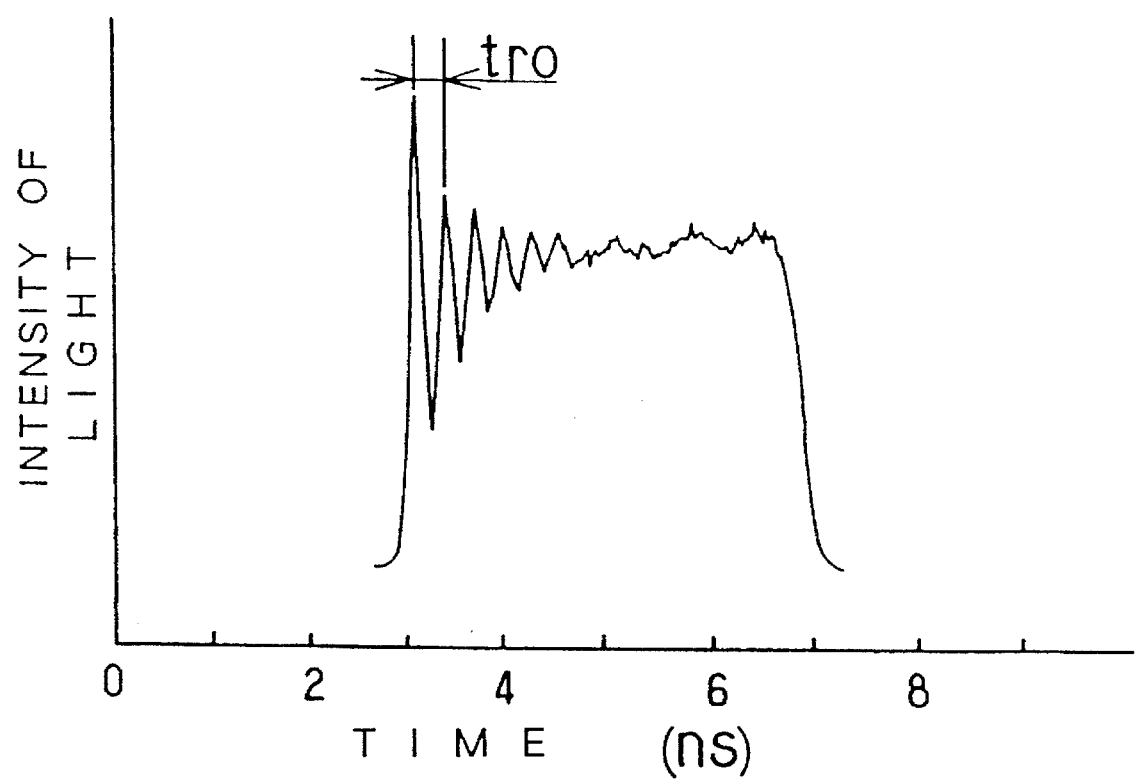
FIG. 5 is a graphic representation of a pulse response waveform of a seroconductor laser.

The light reflected by the half mirror 3 in the upward direction is then reflected by a fixed mirror 5, returned to the half mirror 3, passed therethrough, and input to the photodetector 6 like the counterpart light described above. If the distance twice as large as the distance between the half mirror 3 and the movable mirror 4 is different from that twice as large as the distance between the half mirror 3 and the fixed mirror 4, or in other words there is an optical difference $\Delta L$, interference occurs between the light rays running along the two different paths. The intensity of this interference varies high and low repeatedly with varying moved distance (or displacement) x of the movable mirror 4, and the envelope of the interference is as drawn in FIG. 3. From the intensity of the interference is found the visibility $\gamma$. As described above, the visibility $\gamma$ is represented as $\gamma=Ib/Ia$, where Ia is the intensity of interference when the optical difference is 0 and Ib is the intensity thereof at one selected of the succeeding peaks. The visibility $\gamma$ can easily be found from the output of the photodetector 6 by the use of a commercially-available spectrum analyzer such as made by ADVANTEST CO.

Figure 2:
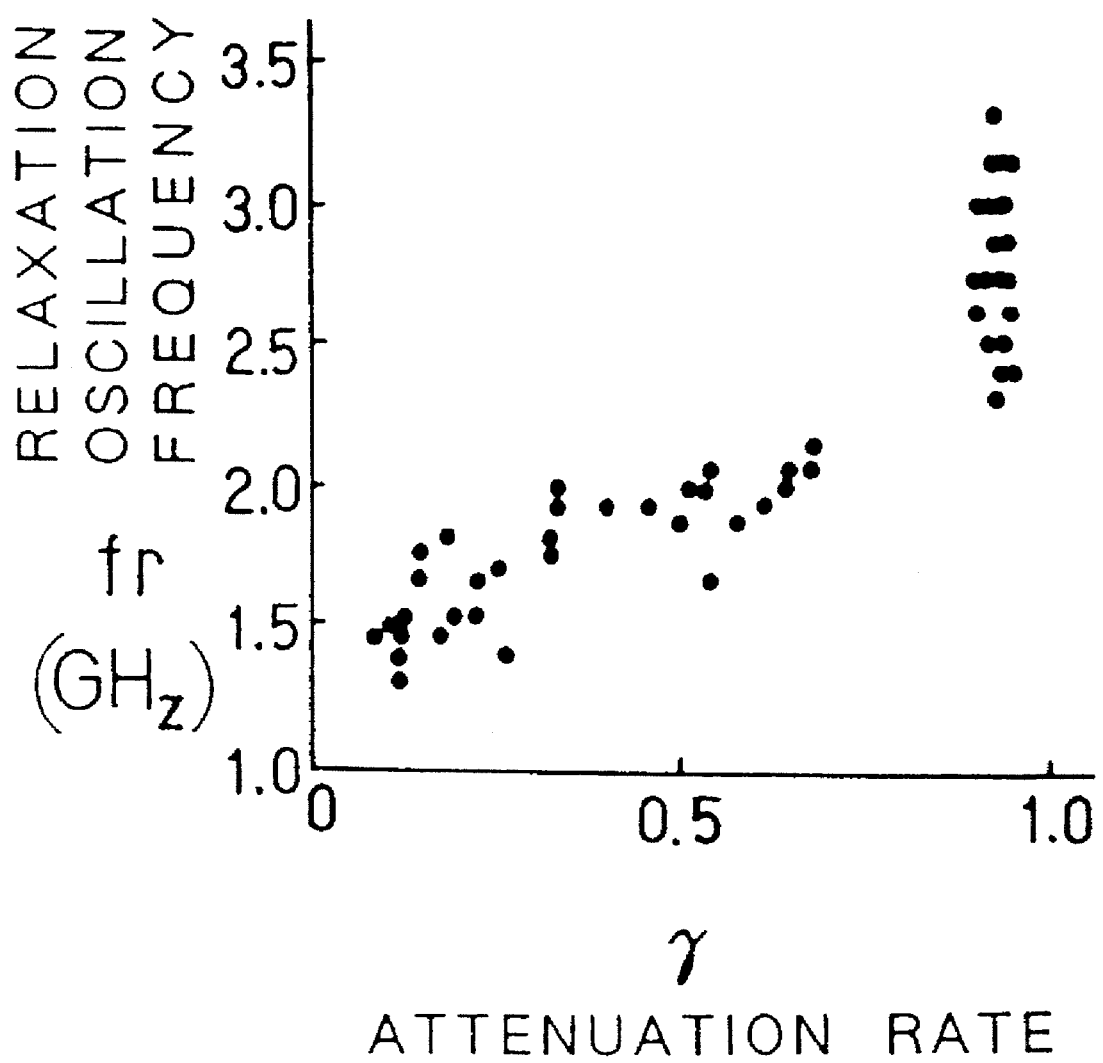
FIG. 2 is a graphic representation showing an example of the correlation between coherence and relaxation oscillation frequency for use in the method for selecting a semiconductor laser of the present invention.

In turn, each sample thus measured for visibility $\gamma$ is further measured for relaxation oscillation period using an oscilloscope in a conventional manner. From the relaxation oscillation period thus measured is found the relaxation oscillation frequency of the sample, followed by finding the correlation between the visibility $\gamma$ and the relaxation oscillation frequency for each sample as shown in FIG. 2. It is sufficient to measure about 100 to about 200 samples to statistically give a correlation diagram.

The correlation of FIG. 2 obtained in the manner described above is one between the relaxation oscillation frequency of, for example, a general purpose semiconductor laser exhibiting an average power of about 3 mW and the visibility $\gamma$ of the intensity of interference at the first peak to that at the fourth peak. As can be seen from FIG. 2, as the visibility $\gamma$ increases from 0 to 0.7, the relaxation oscillation frequency $f_r$ increases gradually from about 1.3 $GH_z$ to about 2.1 $GH_z$, and by contrast as the visibility $\gamma$ increases from 0.7 to 1, especially from 0.9 to 1, the frequency $f_r$ increases abruptly from about 2.3 $GH_z$ to about 3.5 $GH_z$. Therefore, if semiconductor lasers exhibiting a relaxation oscillation frequency of, for example, 2.3 $GH_z$ or higher are to be selected, the selection is achieved on the basis of the graph shown in FIG. 2; semiconductor lasers of, for example, $\gamma=0.8$ or more are considered appropriate while those of $\gamma<0.8$ considered inappropriate. Thus, the selection of a semiconductor laser is accomplished by merely measuring the coherence thereof using a conventional interferometer.

As has been described, according to the present invention the relaxation oscillation frequency of a semiconductor laser can be measured employing a conventional method of measuring the coherence of the laser; hence, semicoductor lasers exhibiting high speed response characteristics can be selected with ease thereby obtaining optimal semiconductor lasers for optical data communications with low cost.

While only certain presently preferred embodiments have been described in detail, as will be apparent with those familiar with the art, certain changes and modifications can be made without departing from the spirit and scope of the invention as defined by the following claims.

What is claimed is:

1. A method of obtaining data for selecting a semiconductor laser exhibiting a desired relaxation oscillation frequency, comprising the steps of:

(a) finding a correlation between a visibility of interference fringes of laser light generated by a sampled semiconductor laser and a relaxation oscillation frequency of the sampled semiconductor laser; and (b) measuring a visibility of interference fringes of laser light generated by each of semiconductor lasers to be subjected to selection and finding a relaxation oscillation frequency of said each of semiconductor lasers from the visibility thus measured with use of the correlation.

2. The method of obtaining data for selecting a semiconductor laser of claim 1, wherein said visibility is measured by obtaining a rate of an intensity of interference using Michelson interferometer.

3. The method of obtaining data for selecting a semiconductor loser of claim 1, wherein said visibility is measured by obtaining a rate of an intensity of interference using Mach-Zehnder interferometer.

4. The method of obtaining data for selecting a semiconductor laser of claim 1, wherein said correlation is obtained by pulse driving said semiconductor laser, signals which are received by an ultra-high speed light-receiving element are represented on an oscilloscope, obtaining a relaxation oscillation period from a response wave form on said oscilloscope and obtaining a relaxation oscillation frequency from said period.

* * * * *